(12) United States Patent
Dallaserra et al.

(10) Patent No.: US 11,266,046 B2
(45) Date of Patent: Mar. 1, 2022

(54) HEATSINK FOR MULTIPLE MEMORY MODULES

(71) Applicant: BULL SAS, Les Clayes-sous-Bois (FR)

(72) Inventors: Luc Dallaserra, Paris (FR); Marc Raeth, Tacoignieres (FR)

(73) Assignee: Bull SAS, Les Clayes-sous-Bois (FR)

( * ) Notice: Subject to any disclaimer, the term of this patent is extended or adjusted under 35 U.S.C. 154(b) by 34 days.

(21) Appl. No.: 16/815,365

(22) Filed: Mar. 11, 2020

(65) Prior Publication Data
US 2020/0305311 A1 Sep. 24, 2020

(30) Foreign Application Priority Data
Mar. 19, 2019 (FR) ...................................... 1902830

(51) Int. Cl.
*H05K 7/20* (2006.01)
*G06F 1/20* (2006.01)

(52) U.S. Cl.
CPC ........... *H05K 7/20809* (2013.01); *G06F 1/20* (2013.01); *H05K 7/2039* (2013.01); *H05K 7/20327* (2013.01); *H05K 7/20336* (2013.01); *G06F 2200/201* (2013.01)

(58) Field of Classification Search
CPC ........... H05K 7/20809; H05K 7/20327; H05K 7/20336; H05K 7/2039; H05K 7/20254; H05K 1/0203; H05K 7/20509; H05K 1/141; H05K 2201/10159; H05K 7/20272; H05K 2201/066; G06F 1/20; G06F 2200/201; G06F 1/185; G06F 1/206; H01L 23/473;
(Continued)

(56) References Cited

U.S. PATENT DOCUMENTS

| 8,570,744 B2 * | 10/2013 | Rau .......................... G06F 1/20 |
| | | 361/702 |
| 2006/0250772 A1 * | 11/2006 | Salmonson ......... H01L 23/3672 |
| | | 361/698 |

(Continued)

FOREIGN PATENT DOCUMENTS

| FR | 2 966 318 A1 | 4/2012 |
| WO | WO 2016/122674 A1 | 8/2016 |

OTHER PUBLICATIONS

Search Report as issued in French Patent Application No. 1902830, dated Jan. 29, 2020.

*Primary Examiner* — Mandeep S Buttar
(74) *Attorney, Agent, or Firm* — Arc IP Law, PC; Joseph J. Mayo

(57) ABSTRACT

A heatsink for a plurality of memory modules that can be connected to an electronic board, each memory module including two heat exchange surfaces, includes at least one envelope including a top surface, at least two outer tabs, configured to be in thermal contact with at least one heat exchange surface of at least one memory module, at least one contact surface, in thermal contact with the fluid cooling system of said electronic board, a plurality of inner tabs, each inner tab being interposed between two memory modules in order to make thermal contact with at least one exchange surface of each of the two memory modules, the envelope is detachably placed against the two exchange surfaces of each memory module, the envelope is mechanically detachably fastened to the board.

7 Claims, 4 Drawing Sheets

(58) Field of Classification Search
CPC .................... H01L 23/4093; H01L 23/367;
H01L 21/4882
USPC ..... 361/699, 679.31, 679.47, 701, 719, 704,
361/679.53, 679.46, 688, 689, 709, 728,
361/729, 679.54; 165/104.33, 80.4, 80.2;
257/E23.098, E23.086, 714.722
See application file for complete search history.

(56) References Cited

U.S. PATENT DOCUMENTS

2008/0084667 A1\* 4/2008 Campbell .......... H05K 7/20554
361/702
2011/0286175 A1\* 11/2011 Iyengar ................ G06F 1/20
361/679.47

\* cited by examiner

[Fig. 1]
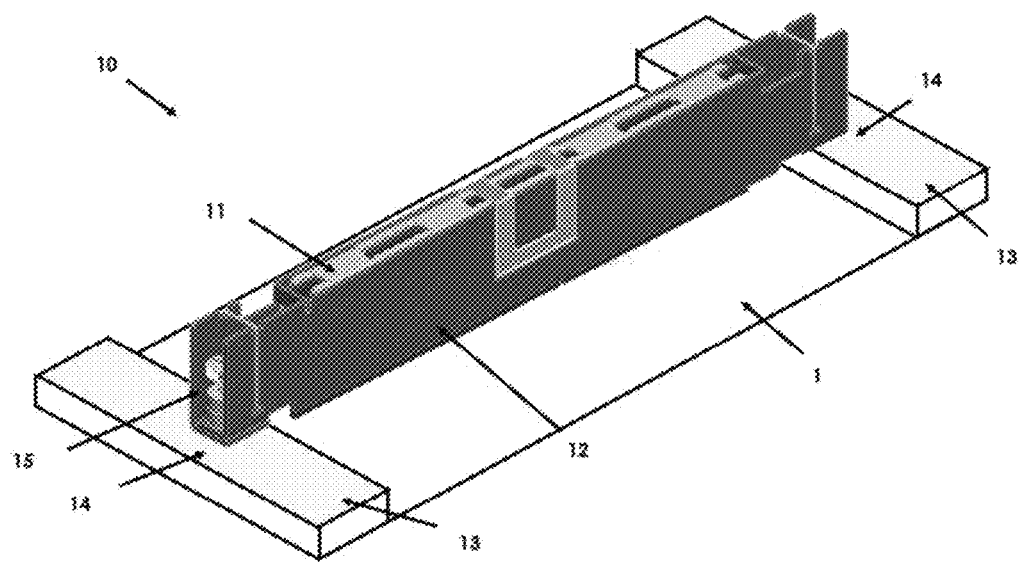
[Fig. 2]
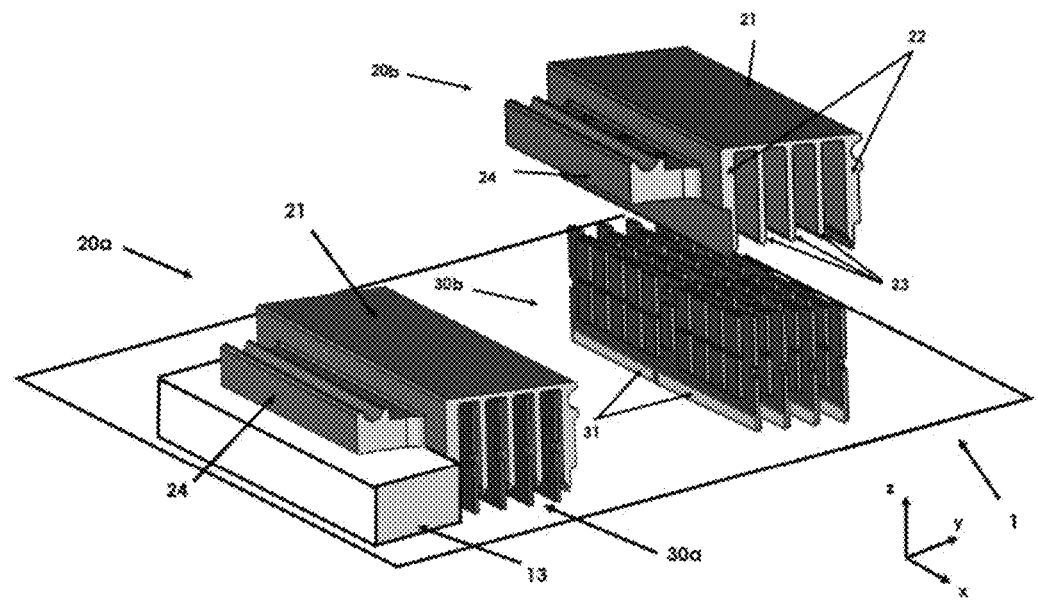

[Fig. 3]
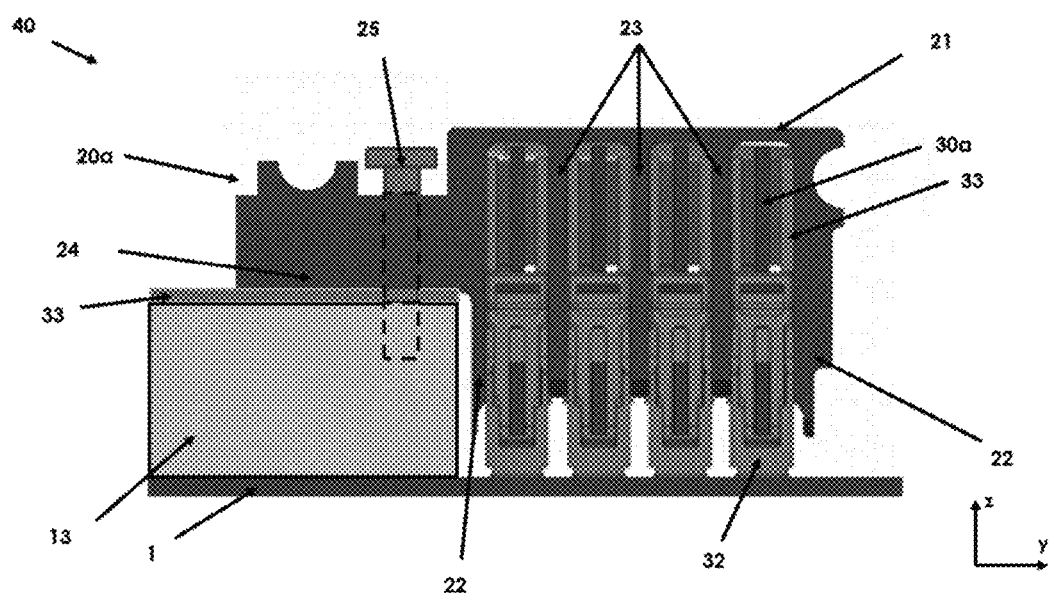
[Fig. 4]
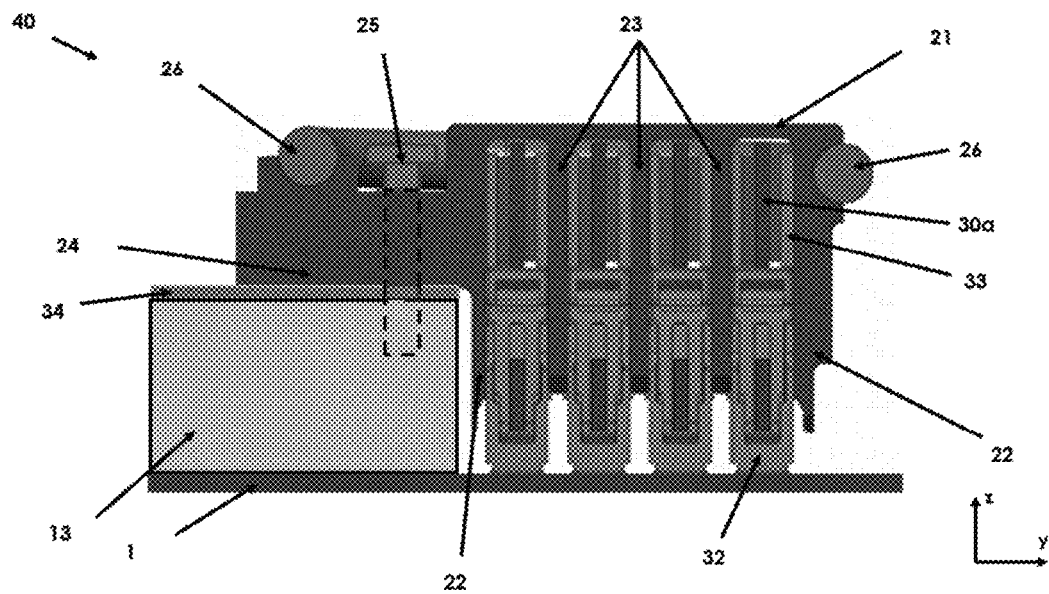

[Fig. 5]
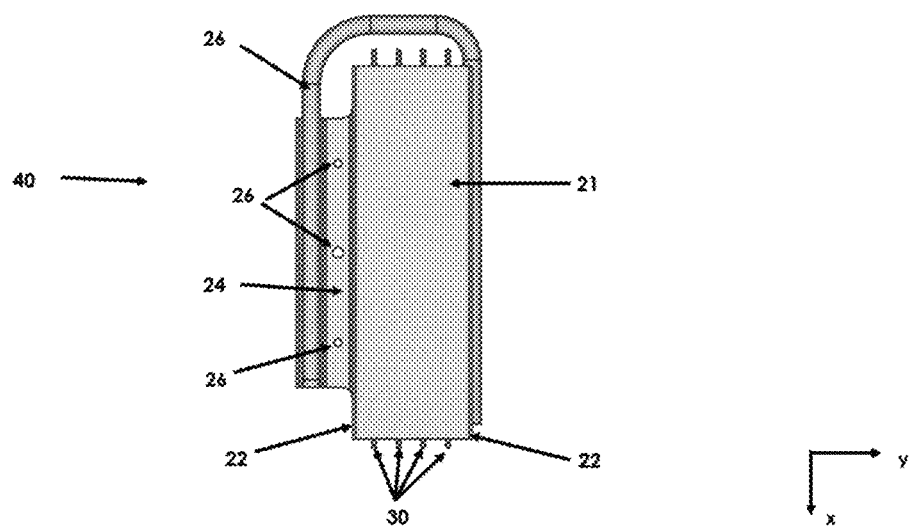
[Fig. 6]
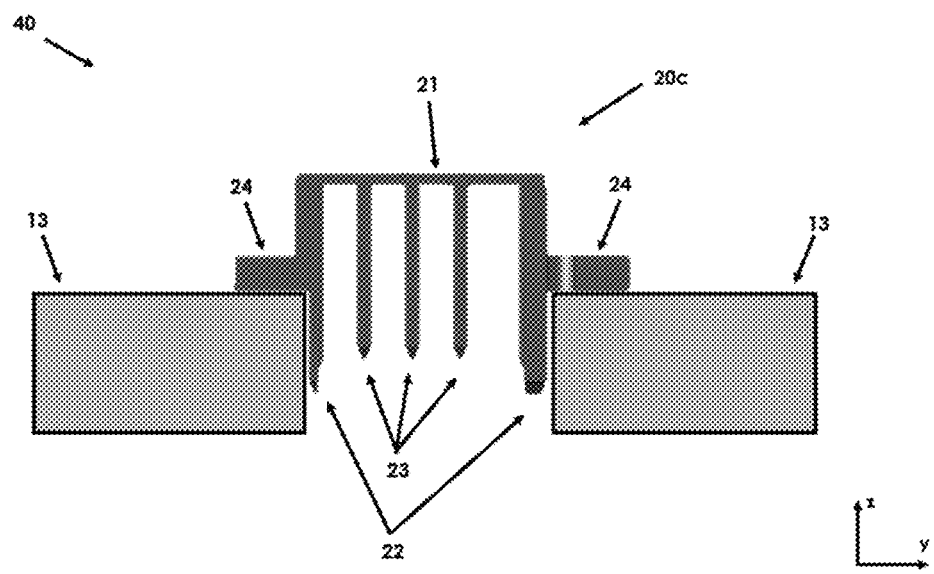

[Fig. 7]
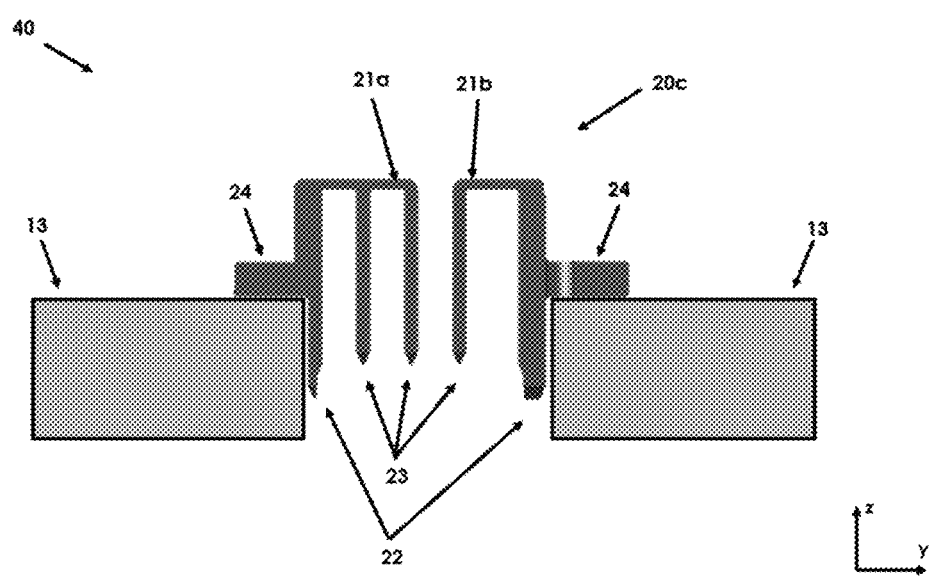

HEATSINK FOR MULTIPLE MEMORY MODULES

CROSS-REFERENCE TO RELATED APPLICATIONS

This application claims the benefit of French Patent Application No. 1902830 filed Mar. 19, 2019, the disclosure of which is herein incorporated by reference in its entirety.

TECHNICAL FIELD OF THE INVENTION

The technical field of the invention is that of memory module cooling systems.

This invention relates to a cooling system for memory modules and in particular for memory modules for compute blades mountable in the rack of a rack system.

TECHNOLOGICAL BACKGROUND OF THE INVENTION

Compute blades for rack systems may for example comprise processors, graphics cards, random access memory such as memory module, mass storage such as hard disks. These compute blades are for example used to perform high-performance computing; the components thereof, therefore, give off heat during operation and need to be cooled to ensure their proper operation and durability.

Since they are rack-mounted, there is not enough air circulation within the rack systems to effectively cool the compute blades using air cooling systems.

For this reason, fluid cooling systems have been developed. These cooling systems comprise, for example, pipes, usually made of copper, in which a fluid circulates. These pipes can be connected directly to the components to be cooled, for example by forming a loop around the components. The fluid can also circulate between two plates, for example made of metal, at least one of the two plates being directly connected to a component to be cooled. It is also possible to braze channels inside a metal plate, e.g. copper, to have fluid flow through them. The fluid can thus flow within a metal plate connected to a component, for example along a memory module.

These fluid cooling systems are bulky since they require a gap around the components for the metal plates accommodating the fluid.

Other hybrid cooling systems exist, which have the advantages of fluid cooling and those of dry contact cooling. This is the case, for example, of patent FR2966318, entitled "Carte électronique pourvue d'un système de refroidissement liquide" (Electronic board provided with a liquid cooling system), which proposes a cooling system comprising a cooling module in which a cooling liquid circulates, and a detachable conductive heatsink, placed in contact with the surfaces of an electronic component through a thermal material to recover the heat energy produced by the component, the heatsink being in dry contact with the cooling module in a detachable manner, for example by screws. This system known from the state of the art is shown in FIG. 1. This system allows to have reduced bulk around the component, since no fluid flows around the component.

FIG. 1 shows a cooling system according to the state of the art.

Thus, in the cooling system 100 shown in FIG. 1, the heat energy produced by the electronic component 110 is recovered by the heatsink 120 through a heat pad and then transferred to the cooling module 130 through the dry contact points 140. The heatsink 120 and the cooling module 130 are held together by screws 150 by dry contact. This makes the heatsink 120 detachable, allowing access to the component 110. The only point of contact between the heatsink 120 and the cooling module 130 is, therefore, the dry contact point 140.

The cooling module 13 is also called "cold plate" and can for example be made of metal, for example aluminum. This cold plate can, for example, extend along the entire compute blade and at least some of the compute blade components can be connected to it. The electronic component 11 can for example be a memory module.

By "memory module" is meant an electronic component with a random access memory for storing and erasing information processed by a computing device. "Random access memory" means a memory with short access time and that is volatile, i.e., resulting in the loss of all data in memory when it is no longer powered.

As technology advances, there is a need to integrate more random access memory on a compute blade of the same restricted dimension. One solution can be to increase the memory capacity of the memory modules cooled by the system 100 of the state of the art. However, since the cost of a memory module relative to its capacity is not linear, increasing the capacity of a memory module results in a much greater proportional increase in its cost. The cost of a compute blade therefore increases very significantly with this solution. A second solution is to increase the number of memory modules on a compute blade, in order to have more random access memory per processor while limiting the cost by having memory modules of smaller capacity which are therefore less expensive.

However, the dimensions of a compute blade that can be mounted in the rack of a rack system are constrained, in particular by the 19-inch standard. Indeed, the total width of the subrack in the rack of rack systems of the state of the art is 482.6 mm, i.e. 19 inches including mounting brackets. This width is the basis for the 19-inch mounting system. Thus, the width of the elements accommodated by the rack of rack systems of the state of the art complies with this 19-inch standard, and the compute blade therefore has restricted dimensions.

In addition, the heatsink 12 of the prior art requires a distance between two components 11 placed side by side. This distance is due, on the one hand, to the bulk of the heat pad separating the component 11 and the heatsink 12. On the other hand, this distance is necessary to be able to surround the component 11 with the heatsink 12 when mounting the component 11 and the heatsink 12, or to be able to remove the heatsink 12 from the component 11 in order to access the component 11. This distance is, for example, around 11 millimeters if the components 11 are memory modules.

However, the current memory module connectors, which allow a memory module to be connected to an electronic board of a compute blade, allow a minimum distance of 8 millimeters between two connectors. This distance is also necessary in particular to comply with routing rules.

It is therefore not possible to reduce the distance between two memory modules to increase the number of memory modules in a compute blade of restricted dimension while using the cooling system 100 of the state of the art.

In addition, the cooling system 10 of the state of the art is expensive to manufacture as it requires at least two screws and several copper plates for each component 11.

Therefore, there is a need for a cooling system for memory modules that allows to keep the minimum distance between two memory modules while using fluid cooling and that is less expensive than the cooling systems of the state of the art.

SUMMARY OF THE INVENTION

The invention offers a solution to the above-mentioned problems by allowing efficient cooling of several memory modules separated by a distance smaller than the distance between two memory modules according to the prior art, and thus allowing more memory modules on a compute blade of restricted dimensions while enabling less expensive manufacturing.

One aspect of the invention thus relates to a heatsink for a plurality of memory modules connectable to an electronic board, said electronic board comprising at least one fluid cooling system and at least one first connector for each memory module of the plurality of memory modules, each memory module comprising at least one second connector configured to be connected to the at least one first connector of the electronic board and two heat exchange surfaces, characterized in that:
  the heatsink comprises at least one envelope, said envelope comprising:
    a top surface configured to at least partially cover the top part of each memory module of the plurality of memory modules,
    at least two outer tabs, each outer tab being configured to be in thermal contact with at least one heat exchange surface of the two heat exchange surfaces of at least one memory module of the plurality of memory modules,
    at least one contact surface, configured to be in thermal contact with said fluid cooling system of said electronic board when each memory module of the plurality of memory modules is connected to said electronic board,
    at least one inner tab, configured to be interposed between two memory modules of the plurality of memory modules in order to make thermal contact with at least one heat exchange surface among the two heat exchange surfaces of each of the two memory modules,
  said envelope is configured to be detachably placed against the two exchange surfaces of each memory module of the plurality of memory modules,
  said envelope is configured to be mechanically detachably fastened to said electronic board when each memory module of the plurality of memory modules is connected to said electronic board.

The invention advantageously allows to reduce the distance between two memory modules, by advantageously having a single inner heatsink tab interposed between two memory modules. This allows more memory modules to be placed on an electronic board of the same dimension as an electronic board of the state of the art.

By virtue of the invention, it is possible to cool several memory modules with a single heatsink, advantageously enabling a lower manufacturing cost.

The top surface configured to cover each memory module advantageously allows to have the shortest possible thermal path between the cold source and each of the memory modules without having the cold source between the memory modules.

Advantageously, the heatsink envelope is detachable, allowing easy access to the memory modules, for example, to replace a memory module when it fails or when capacity increase is desired.

The invention advantageously allows, by having an inner tab in thermal contact with at least one surface of each of the two memory modules between which it is interposed, to capture a large part of the heat emitted by the two modules.

Comprising a contact surface in thermal contact with the fluid cooling system of the electronic board when the memory modules with which it is in contact are connected to the electronic board, i.e. when they are in operation and, therefore, when they heat up, the heatsink allows to redirect the heat from all the memory modules with which it is in contact to the fluid cooling system.

Thus, by capturing and redirecting the heat emitted by the memory modules with which it is in contact, the heatsink alone allows to ensure the durability and proper operation of several memory modules.

Thermal contact of the heatsink envelope with the fluid cooling system advantageously allows to have no fluid to circulate around the memory modules. Thus, problems of bulk associated for example with the inlet and outlet lines for a liquid of the state of the art solutions are avoided. This allows to have a reduced distance between the memory modules.

In addition to the characteristics which have just been mentioned in the preceding paragraph, the heatsink, according to one aspect of the invention, may have one or more of the following complementary characteristics, considered individually or in any technically possible combinations:
  The heatsink further comprises a plurality of thermal interfaces, each thermal interface being interposed either between an exchange surface of a memory module of the plurality of memory modules and an outer tab of the envelope, or between an exchange surface of a memory module of the plurality of memory modules and an inner tab of the envelope.
  The at least one top surface, the at least two outer tabs and the at least one inner tab of the heatsink are arranged so as to form, for each memory module of the plurality of memory modules, a gap adapted to receive the memory module.
  The heatsink comprises two contact surfaces, each contact surface being in thermal contact with the fluid cooling system.
  The heatsink comprises two top surfaces.
  The heatsink further comprises a heat pipe configured to be in thermal contact with the contact surface and with the outer tab of the heatsink envelope furthest from the contact surface.
  The thermal interfaces allow not to damage the memory modules when the envelope is inserted and to produce more efficient thermal contact.
  By comprising two contact surfaces each in thermal contact with the fluid cooling system, the heatsink according to the invention allows better cooling of the plurality of memory modules.
  One advantage of comprising a heat pipe is that the heatsink according to the invention can better cool the memory modules furthest from the fluid cooling system.

Another aspect of the invention relates to an electronic board comprising at least one fluid cooling system, a plurality of memory modules, at least one first electrical connector for each memory module, each memory module comprising at least one second connector configured to be connected to at least one first connector of the electronic board and the heatsink according to the invention.

The invention and its various applications will be better understood after reading the following description and examining the accompanying figures.

BRIEF DESCRIPTION OF THE FIGURES

The figures are presented for information purposes only and in no way limit the invention.

FIG. 1 shows a schematic depiction of a cooling system according to the state of the art.

FIG. 2 shows a schematic depiction of two heatsinks for a memory module according to a first embodiment of the invention.

FIG. 3 shows a schematic depiction of a heatsink according to the first embodiment of the invention in a view along a plane perpendicular to the plane of the electronic board 1.

FIG. 4 shows a schematic depiction of a heatsink according to a second embodiment of the invention in a view along a plane perpendicular to the plane of the electronic board 1.

FIG. 5 shows a schematic depiction of a heatsink according to a second embodiment of the invention in a top view in the plane of the electronic board 1.

FIG. 6 shows a schematic depiction of a heatsink according to a third embodiment of the invention in a view along a plane perpendicular to the plane of the electronic board 1.

FIG. 7 shows a schematic depiction of a heatsink according to a variant to the third embodiment of the invention in a view along a plane perpendicular to the plane of the electronic board 1.

DETAILED DESCRIPTION OF AT LEAST ONE EMBODIMENT OF THE INVENTION

The figures are presented for information purposes only and in no way limit the invention. Unless otherwise specified, the same element appearing on different figures shall have a single reference.

FIG. 2 shows a schematic depiction of two heatsinks for a memory module according to a first embodiment of the invention.

FIG. 2 shows an electronic board 1 comprising a fluid cooling system 13. This fluid cooling system 13 is known to the person skilled in the art. It further comprises a fluid inlet and a fluid outlet. This fluid cooling system 13 can be for example a cold plate, extending over a large part of the surface of the electronic board 13 so that each of the heatsinks according to the invention is in thermal contact with the same cold plate and thus with the same fluid cooling system 13.

When it is mentioned that two elements are "in thermal contact", it is understood that at least one surface of one element captures the heat emitted by the other surface, either by being in direct contact or through a thermal interface, for example formed by a thermal paste or any other thermal material.

FIG. 2 further depicts two envelopes 20a and 20b, each forming a heatsink according to the invention, and a plurality of memory modules 30a and 30b. The electronic board 1 further comprises at least one first connector (not shown) per memory module of the plurality of memory modules 30, configured to be connected to at least one second connector of a memory module.

In a non-limiting manner, each envelope 20a and 20b comprises a top surface 21, two outer tabs 22, three inner tabs 23 and a contact surface 24.

The plurality of memory modules 30a or 30b can, for example, comprise DIMM (Dual Inline Memory Module, literally translated into French as "Module Mémoire à Double Rangée") memory modules. A memory module in the DIMM format comprises two rows of contacts, one on each side of the memory module, with the contacts on each face being electrically separated from the contacts of the other face. According to one variant, the plurality of memory modules 30a or 30b can for example comprise SIMM (Single Inline Memory Module, literally translated into French as "Module Mémoire à Simple Rangée") memory modules. A memory module in the SIMM format comprises two rows of contacts, one on each side of the memory module, with the contacts on each face being the same as on the other face. It appears that the person skilled in the art may furthermore use any other format of memory modules known from the state of the art to implement the invention.

In a non-limiting manner, each memory module of the plurality of memory modules 30a or 30b comprises a row of electrical contacts on one face and a row of electrical contacts on the other face (not shown). Thus, a memory module comprises for example a second connector 31 comprising 2 rows of electrical contacts. It is possible that one or more memory modules of the plurality of memory modules 30 may additionally comprise a plurality of second connectors, according to the memory module formats known from the state of the art.

The second connector 31 is configured to be connected to a first connector of the electronic board 1. When a memory module comprises a plurality of second connectors 31, the electronic board 1 comprises a plurality of first connectors configured to be connected to the plurality of second connectors.

Hereinafter, when it is mentioned that a memory module is "connected" to the electronic board 1, it is understood that the first connector of the electronic board 1 is connected to the second connector of the memory module.

Each memory module comprises two heat exchange surfaces. "Heat exchange surface" of a memory module means its two side surfaces. A heat exchange surface of a memory module of the plurality of memory modules 30a or 30b is a surface of the memory module located in the plane formed by the longitudinal x-axis and vertical z-axis when the memory module is oriented along the x-axis as shown in FIG. 2.

The envelopes 20a and 20b, each forming a heatsink according to the first embodiment of the invention, allow recovering the heat emitted by the plurality of memory modules 30a and 30b, respectively, when they are in operation, that is when they are connected to the electronic board 1. This heat is then redirected to the fluid cooling system 13.

Each envelope 20a and 20b comprises a top surface 21, configured to at least partially cover the top part of at least one memory module of the plurality of memory modules 30a or 30b. "Covering" the top part of a memory module means that the top surface 21 is positioned over the top part of a memory module. That is to say that when a top view of the envelope 20a or 20b and of the plurality of memory modules 30a or 30b is considered, the top surface 21 is visible and at least partially hides the top part of the memory modules, when the top surface 21 is made of an opaque material. The "top part" of a memory module means the upper edge of a memory module when the memory module is in an upright position, that is when its connector 31 is downwards, as depicted in FIG. 2. This top surface, in thermal contact with the outer tabs 22, the inner tabs 23 and the contact surface 24, allows to create a short thermal path between the memory modules 30 and the fluid cooling systems 13. The top surface 21 also provides rigidity for the entire envelope 20 and allows holding of the outer tabs 22 and the inner tabs 23 together. The top surface 21 can also be used to maintain a constant gap between a first outer tab 22 and an inner tab 23, between two inner tabs 23, and between an inner tab 23 and a second outer tab 22. This constant gap allows each memory module of the plurality of memory modules 30a or 30b to be surrounded with the envelope 20a or 20b. It is therefore necessary that this gap has a distance greater than the thickness of a memory module.

The envelopes 20a and 20b each comprise a plurality of outer tabs 22, for example two outer tabs 22, configured to be in thermal contact with at least one heat exchange surface of at least one memory module of the plurality of memory modules 30a or 30b. For example, each outer tab 22 of the envelope 20a in FIG. 2 is in thermal contact with a heat exchange surface of one memory module of the plurality of memory modules 30a. Thus, along the y-axis shown in FIG. 2, the first outer tab 22, which is the leftmost along the y-axis, is in thermal contact with the first exchange surface of the first memory module, that which is leftmost of the plurality of memory modules 30a. Also along the y-axis shown in FIG. 2, the second outer tab 22, the rightmost of the envelope 20a along the y-axis, is in thermal contact with the second exchange surface of the last memory module, that which is rightmost of the plurality of memory modules 30a.

The first heat exchange surface of a memory module is, for example, its left-hand exchange surface along the y-axis, and the second heat exchange surface is for example the surface opposite to its first exchange surface, that is its right-hand surface along the y-axis in FIG. 2.

The envelopes 20a and 20b each comprise at least one inner tab 23, for example three inner tabs 23, each inner tab being configured to be interposed between two memory modules of the plurality of memory modules 30a or 30b in order to make thermal contact with at least one exchange surface of each of the two memory modules.

For example, as depicted in FIG. 2, the inner tab 23 of the envelope 20b leftmost along the y-axis is configured to be interposed between two memory modules, for example between the two leftmost memory modules of the plurality of memory modules 30b along the y-axis. When the memory modules of the plurality of memory modules 30a are connected to the electronic board 1, and the envelope 20a is surrounding the memory modules, the inner tabs 23 are interposed between two memory modules. Thus, the tab 23 of the leftmost envelope 20a along the y-axis is interposed between the two leftmost memory modules along the y-axis of the plurality of memory modules 30a. This allows to produce:
  a first thermal contact between the second heat exchange surface of the first memory module along the y-axis and the first inner tab 23;
  a second thermal contact between the first heat exchange surface of the second memory module and the first inner tab.

For this purpose, the inner tab 23 can comprise two heat exchange surfaces as shown in FIG. 2. In the same way as for a memory module, an inner tab may comprise a first heat exchange surface and a second heat exchange surface, each heat exchange surface of the inner tab 23 lying in the same plane as the heat exchange surfaces of a memory module. The inner tabs 23 thus allow to recover part of the heat produced by the two memory modules between which it is interposed. The inner tabs 23 are in thermal contact with the top surface 21, for example by being integral with the top surface 21. This thermal contact allows the heat recovered from the memory modules to be redirected to the contact surface 24 via the top surface 21.

In addition, the inner tabs 23 allow to have a gap between two memory modules that is less than a distance from the prior art while still providing efficient cooling. Indeed, only one tab is required between two memory modules. The only factor in the envelope 20a or 20b impacting the spacing between two memory modules on the electronic board 1 is thus the thickness of an inner tab 23. By virtue of the invention, it is particularly possible to efficiently cool a plurality of memory modules with a single device, the heatsink. By minimizing the bulk of the device and using inner tabs 23, it is also possible to put more memory modules on an electronic board 1 of the same dimension as in the prior art, for example.

The envelopes 20a and 20b each comprise a contact surface 24. The contact surface 24 can, for example, be a rectangular block as shown in FIG. 2. The contact surface 24 is configured to be in thermal contact with the fluid cooling system 13, in order to redirect the heat from the memory modules captured by the outer tabs 22 and by the inner tabs 23 to the fluid cooling system 13. In a preferred embodiment, the contact surface 24 is configured to be in thermal contact with the fluid cooling system 13 when the memory modules are connected to the electronic board 1. The contact surface 24 can be in direct contact with the cooling system 13. This thermal contact can be a contact of the contact surface 24 with a waterblock, commonly used to cool the processors of a compute blade, for example. As this waterblock is included in the fluid cooling system 13, the contact surface 24 is then in thermal contact with the fluid cooling system 13. In the case of the use of waterblocks as a cold source for the invention, it is then necessary to increase the fluid flow rate inside the waterblock, since the waterblock no longer just has to capture a majority of the 280 watts produced by the processor, but also has to capture a majority of the 80 watts of the plurality of memory modules 30a or 30b.

The contact surface 24 may for example be in thermal contact with an outer tab 22, as shown in FIG. 2, for example, by being integral with the outer tab 22. In a variant, the contact surface 24 may be in thermal contact with the top surface 21 (not shown).

The envelopes 20a and 20b can be made of metal, for example copper or aluminum. The envelopes 20a and 20b can also be made of an alloy, or any other thermally conductive material.

In a preferred embodiment, to minimize the manufacturing cost, each envelope 20a and 20b can be made for example in one piece, for example of aluminum, from which material has been extruded to form the comb shape of the envelope and the contact surfaces 24, top 21 and the outer 22 and inner 23 tabs. In this way, all parts of the envelope are integral, in order to have a rigid envelope, and good heat conductivity.

In another embodiment, the envelopes 20a and 20b are not in one piece but in several parts, for example several "U" shaped parts brazed together to create an assembly comprising the inner tabs 23, the outer tabs 22 and the top surface 21, and a block brazed with the assembly so that the envelope 20a or 20b thus formed additionally comprises the contact surface 24.

FIG. 3 shows a view along a plane perpendicular to the plane of the electronic board 1 of a heatsink according to the first embodiment of the invention.

The view plane in FIG. 3 is a plane along the horizontal y-axis and vertical z-axis. As shown in FIG. 3, the heatsink 40 according to a first embodiment may comprise an envelope 20a and a detachable fastening system 25.

The detachable fastening system 25 can be, for example, a screw, such as a captive screw, or any other system allowing the envelope 20a to be mechanically fastened in a detachable way to the electronic board 1 when the memory modules 30a are connected to the electronic board 1. "Detachably fastening" means that the envelope 20a can be anchored in such a way that this anchorage is reversible, that is it is possible for the envelope to no longer be anchored to the electronic board 1.

This detachable fastening system 25 of the envelope 20a may for example be a plurality of screws comprising a thread 25, as shown in FIG. 3. A plurality of threaded holes can for example cross the contact surface 24, in order to screw a screw through the contact surface 24.

A hole, threaded or not, can be made directly in the electronic board 1 to screw the screw therein in the case in which the hole is threaded, or to insert the screw therethrough and fasten the envelope for example by means of a nut.

In a preferred embodiment, a threaded hole is present in the fluid cooling system 13 as shown in FIG. 3, for receiving a screw comprising a thread, thus enabling the envelope 20a to be detachably fastened to the fluid cooling system 13. Since the fluid cooling system 13 is included in the electronic board 1, the envelope 20a is thus mechanically fastened to the electronic board 1. In addition, this allows to ensure that the contact surface 24 remains in thermal contact with the fluid cooling system 13.

The electronic board 1 comprises a plurality of first connectors 32, for the connection with a plurality of second connectors 31 included in the memory modules 30a and/or 30b.

Each exchange surface of each memory module 30a is in thermal contact with the envelope 20a, either with two inner tabs 23, or with an outer tab 22 and an inner tab 23. This thermal contact can be a direct contact between the memory module and the envelope 20a in a nonpreferred embodiment.

In a preferred embodiment, a thermal interface 33 is interposed between each heat exchange surface of the memory modules 30a and the envelope 20a. That is to say that a thermal interface 33 is present at each thermal contact, for example between a heat exchange surface of a memory module 30a and an inner tab 23, for example between a heat exchange surface of a memory module 30a and an outer tab 22.

This thermal interface 33 is made of a thermal material, such as a soft thermal paste. For example, this soft thermal paste may include silicone. An advantage of using a soft thermal paste is that it is deformable. Thus, it is possible to have an optimal thermal contact while reducing the risk of damaging the components of the memory module 30a and/or the envelope 20a. In addition, the thermal interface 33 can be machined to be sticky on one side and smooth on the other side. This allows the thermal interface 33 to adhere to the memory module 30a and to be able to easily surround the memory modules 30a with the heatsink 40 comprising the envelope 20a without damaging the thermal interface 33 or the memory modules 30a.

The thermal interfaces 33 have standard shapes and sizes that are suitable for use with different types of memory modules. For example, the thermal interfaces 33 are generally substantially rectangular in shape, with a thickness ranging, for example, from about 0.5 millimeters to about 5 millimeters, and the allowable compression ratio for these thermal interfaces is from about 1 percent to about 55 percent when interposed between the envelope 20a and the memory modules 30a at the thermal contact areas.

The inner tabs 23 and the outer tabs 22 are shaped so as not to damage the thermal interfaces 33 when inserting the envelope 20a between and around the memory modules 30a. The inner tabs 23 which have to be inserted between two thermal interfaces 33 may, for example, have a beveled shape on their lower surface, for example double beveled along their entire length. "Double beveled" means two bevels made on either side of the inner tab 23. This double bevel allows not to damage either of the two thermal interfaces 33 between which the inner tab 23 is interposed. The inner tab 23 can also have a rounded shape on its lower surface along its entire length, so as not to damage any thermal interface 33.

The outer tabs 22 may also have a beveled shape at their lower surface, for example as a simple bevel if they are in thermal contact only with a memory module 30a and therefore in direct contact with only one thermal interface 33 as shown in FIG. 3.

In a variant, a thermal interface 33 can also be interposed between the contact surface 24 of the envelope 20a and the cooling system 13.

By virtue of the invention, the distance between two memory modules can be for example 8.3 millimeters. For example, the thermal interfaces 33 may have a thickness of 1.5 millimeters, reduced to 1.3 millimeters when they are compressed by the insertion of an inner tab 23. An inner tab 23 may for example be 2.2 millimeters thick. With each memory module 30a having a thickness of 3.5 millimeters, that is 1.75 millimeters from the center of the memory module to its edge, the center-to-center distance between two memory modules is indeed (1.75*2)+(1.3*2)+2.2=8.3 millimeters.

It will be apparent to the person skilled in the art that these dimensions can be modified, an increase or a reduction in the thickness of an inner tab 23 leading respectively to an increase or a reduction in the thickness of the thermal interface 33 within possible limits. Similarly, by using thicker memory modules 30a, it is possible to keep the same thickness of the inner tab 23 by reducing the thickness of the thermal interface 33.

FIG. 4 shows a view along a plane perpendicular to the plane of the electronic board 1 of a heatsink according to a second embodiment of the invention.

The view plane in FIG. 4 is a plane along the horizontal y-axis and vertical z-axis. As shown in FIG. 4, the heatsink 40 according to a second embodiment may comprise an envelope 20a, a detachable fastening system 25 and a heat pipe 26.

The heat pipe 26 is in thermal contact with the contact surface 24 and with an outer tab 22 with which the contact surface 24 is not in thermal contact. Thus, the heat pipe 26 allows redirecting the heat captured by an outer tab 22 to the contact surface 24 and thus to the cooling system 13. This heat pipe comprises for example a tubular copper envelope with a phase-change material inside that allows the evaporation and condensation of a fluid, in order to create a flow from the hottest source, where a fluid vaporizes, to the coldest source, where the fluid condenses.

A heat pipe 26 may for example be necessary when the fluid cooling system 13 operates with a fluid having a temperature around 40 degrees Celsius. Indeed, at such an operating temperature, the memory modules furthest away from the fluid cooling system 13 are not cooled sufficiently by the envelope 20a to remain at a temperature below their maximum operating temperature, above which they stop operating. A heat pipe is then required to redirect the heat from the outer tab 22 furthest from the fluid cooling system 13 or furthest from the contact surface 24, for example the rightmost outer tab 22 along the y-axis in FIG. 4.

FIG. 5 shows a top view in the plane of the electronic board 1 of the heatsink 40 according to the second embodiment of the invention.

The heat pipe 26 can for example be in thermal contact with the contact surface 24 by direct contact with the top surface of the contact surface 24. Thermal contact can also be achieved by interposing a thermal interface such as the thermal interface 33 between the contact surface 24 and the heat pipe 26. The contact surface 24 may for example comprise machining on its top surface to accommodate the heat pipe. This machining may for example be in the form of a half-cylinder along the entire length of the top surface of the contact surface 24, for example along the longitudinal x-axis.

The heat pipe 26 can for example be in thermal contact with the outer tab 22 furthest away from the fluid cooling system 13 and the contact surface 24. This thermal contact can for example be a direct contact. It can also be achieved by interposing a thermal interface such as thermal interface 33 between the outer tab 22 and the heat pipe 26. The outer tab 22 in thermal contact with the heat pipe 26 can for example comprise machining on its outer surface to accommodate the heat pipe. This machining may for example be in the form of a half-cylinder along the entire length of the outer surface of the outer surface 22, for example along the longitudinal x-axis.

FIG. 6 shows a view along a plane perpendicular to the plane of the electronic board 1 of a heatsink 40 according to a third embodiment of the invention.

In this third embodiment of the invention, an envelope 20c included in the heatsink 40 is in thermal contact with two blocks of the fluid cooling system 13. This advantageously allows to dispense with heat pipe 26, since the distance between the memory module 30 furthest away from the fluid cooling system 13 and said fluid cooling system 13 is reduced by half. Indeed, the memory module 30 furthest away from the fluid cooling system 13 is now the memory module or modules 30 in the center of the plurality of memory modules 30.

This third embodiment of the invention involves a particular arrangement of the fluid cooling system 13, for example, that a plurality of memory modules is located between two processors cooled by the fluid cooling system 13. Thus, the processors are each cooled with a waterblock included in the fluid cooling system 13, and the two contact surfaces 24 of the heatsink 40 are in thermal contact with the two waterblocks of the two processors cooled by the fluid cooling system 13.

FIG. 7 shows a view along a plane perpendicular to the plane of the electronic board 1 of a heatsink 40 according to a variant of the third embodiment of the invention.

In this variant to the third embodiment of the invention, the envelope 20c included in the heatsink 40 and the two contact surfaces 24 of which are each in contact with a block of the fluid cooling system 13 comprises two top surfaces 21a and 21b.

Thus, as shown in FIG. 7, a part of the plurality of inner tabs 23 is in thermal contact with the first top surface 21a and another part of the plurality of inner tabs 23 is in thermal contact with the second top surface 21b. In a preferred embodiment, the inner tabs 23 are integral with the top surface 21a or 21b with which they are in thermal contact.

An advantage of comprising two top surfaces instead of one is to decrease the granularity, that is to increase the number of parts, allowing easier maintenance. An additional advantage is to reduce the effort of inserting the envelope 20c between and around the memory modules 30a or 30b.

What is claimed is:

1. A heatsink for a plurality of memory modules connectable to an electronic board, said electronic board comprising at least one fluid cooling system and at least one first connector for each memory module of the plurality of memory modules, each memory module comprising at least one second connector configured to be connected to the at least one first connector of the electronic board and two heat exchange surfaces, wherein said heatsink comprises:
    at least one envelope, said at least one envelope comprising
        At least one top surface configured to at least partially cover a top part of each memory module of the plurality of memory modules,
        at least two outer tabs, wherein each outer tab of said at least two outer tabs is configured to be in thermal contact with at least one heat exchange surface of the two heat exchange surfaces of at least one memory module of the plurality of memory modules,
        at least one contact surface configured to be in thermal contact with said at least one fluid cooling system of said electronic board when each memory module of the plurality of memory modules is connected to said electronic board,
        at least one inner tab configured to be interposed between two memory modules of the plurality of memory modules in order to make thermal contact with at least one heat exchange surface among the two heat exchange surfaces of each of the two memory modules, wherein the at least one inner tab comprises a lower surface and a double beveled shape on said lower surface,
    wherein said at least one envelope is configured to be detachably placed against the two heat exchange surfaces of each memory module of the plurality of memory modules, and
    wherein said at least one envelope is further configured to be mechanically detachably fastened to said electronic board when each memory module of the plurality of memory modules is connected to said electronic board.

2. The heatsink according to claim 1, further comprising a plurality of thermal interfaces, each thermal interface of said plurality of thermal interfaces being interposed either
    between an exchange surface of a memory module of the plurality of memory modules and an outer tab of the at least one envelope, or
    between an exchange surface of a memory module of the plurality of memory modules and an inner tab of the at least one envelope.

3. The heatsink according to claim 1, wherein the at least one top surface, the at least two outer tabs and the at least one inner tab are arranged so as to form, for each memory module of the plurality of memory modules, a gap adapted to receive the each memory module.

4. The heatsink according to claim 1, further comprising two contact surfaces, each contact surface of said two contact surfaces being in thermal contact with the at least one fluid cooling system.

5. The heatsink according to claim 1, wherein said at least one top surface comprises two top surfaces.

6. The heatsink according to claim 1, further comprising a heat pipe configured to be in thermal contact with a contact surface and with ran outer tab of the at least two outer tabs of the at least one envelope furthest from the contact surface.

7. An electronic board comprising: at least one fluid cooling system,
- a plurality of memory modules, at least one first electrical connector for each memory module of the plurality of memory modules, each memory module comprising at least one second connector configured to be connected to said at least one first electrical connector of the electronic board and two heat exchange surfaces of a heatsink, said heatsink comprising
  - at least one envelope, said at least one envelope comprising
    - at least one top surface configured to at least partially cover a top part of each memory module of the plurality of memory modules,
    - at least two outer tabs, wherein each outer tab of said at least two outer tabs is configured to be in thermal contact with at least one heat exchange surface of the two heat exchange surfaces of at least one memory module of the plurality of memory modules,
    - at least one contact surface configured to be in thermal contact with said at least one fluid cooling system of said electronic board when each memory module of the plurality of memory modules is connected to said electronic board,
    - at least one inner tab configured to be interposed between two memory modules of the plurality of memory modules in order to make thermal contact with at least one heat exchange surface among the two heat exchange surfaces of each of the two memory modules, wherein the at least one inner tab comprises a lower surface and a double beveled shape on said lower surface,
  - wherein said at least one envelope is configured to be detachably placed against the two heat exchange surfaces of each memory module of the plurality of memory modules, and
- wherein said at least one envelope is further configured to be mechanically detachably fastened to said electronic board when each memory module of the plurality of memory modules is connected to said electronic board.

\* \* \* \* \*